1986

United States Patent [19]

Nakayama

[11] Patent Number: 4,595,883

[45] Date of Patent: Jun. 17, 1986

[54] EMITTER-FOLLOWER TYPE SINGLE-ENDED PUSH-PULL CIRCUIT

[75] Inventor: Kazuaki Nakayama, Tokyo, Japan

[73] Assignee: Pioneer Electronic Corporation, Tokyo, Japan

[21] Appl. No.: 647,789

[22] Filed: Sep. 6, 1984

[30] Foreign Application Priority Data

Sep. 6, 1983 [JP] Japan .................. 58-162508

[51] Int. Cl.$^4$ ............. H03F 3/30; H03F 3/45
[52] U.S. Cl. .................. 330/255; 330/257; 330/259; 330/260; 330/264; 330/268
[58] Field of Search .......... 330/253, 255, 257, 259, 330/260, 267, 264, 268

[56] References Cited

FOREIGN PATENT DOCUMENTS 157106 12/1981 Japan ..................... 330/268

Primary Examiner—James B. Mullins
Attorney, Agent, or Firm—Sughrue, Mion, Zinn, Macpeak & Seas

[57] ABSTRACT

An emitter-follower type single-ended push-pull circuit for which no temperature compensation is required and for which it is unnecessary to adjust the idle current. First and second complementary current mirror circuits are coupled as loads of respective first and second complementary differential amplifiers. Each of the differential amplifiers includes a first transistor to which an input signal voltage is applied, a second transistor to which a voltage at the output terminal of the circuit is applied as an input signal with the second transistor being connected in parallel with the first transistor, and a third transistor to which a voltage corresponding to an emitter or source voltage of a respective one of the output transistors is applied as an input voltage. The collector or drain output of the third transistor is employed as a drive output to a respective drive transistor in the output stage.

9 Claims, 9 Drawing Figures

EMITTER-FOLLOWER TYPE SINGLE-ENDED PUSH-PULL CIRCUIT

BACKGROUND OF THE INVENTION

The present invention relates to an cutoffless class B emitter-follower type single-ended push-pull (SEPP) circuit.

In general, in an emitter-follower type SEPP circuit, class B amplification is employed for reasons of efficiency. In such a circuit, it is essential to cause an idle current to flow in order to smoothly connect the upper and lower transfer characteristics. In a conventional circuit of this type, when one of the transistors is turned on, the other transistor is cut off, and switching distortion takes place when switching from one transistor to the other. In order to eliminate this difficulty, a cutoffless class B circuit is often employed in which each transistor is prevented from being cut off using a servo circuit. In this case, the switching distortion is largely eliminated. However, it should be noted that there is still present a current distortion due to the inherent nonlinearities in the current transfer characteristics of transistors or a voltage distortion due to the exponential voltage transfer characteristics.

In the case of a bipolar transistor, if no temperature compensation is employed, the idle current may undergo thermal runaway. Heretofore, no servo control has been applied to the idle current. Accordingly, the idle current value changes with variations of signal strength and ambient temperature. Irrespective of the presence or absence of an input signal, the operating point tends to change over both long and short periods.

Temperature compensation is considerably difficult to implement. Especially in the conventional cutoffless class B circuit, a positive feedback technique must be employed, and therefore the instability of the idle current is increased. This, in association with the fact that temperature compensation cannot be effected perfectly, makes the design more difficult.

FIG. 1 shows an example of a conventional cutoffless class B SEPP circuit. Transistors $Q_{7a}$ and $Q_{7b}$, and $Q_{8a}$ and $Q_{8b}$ are drive transistors and output transistors which form the SEPP circuit. Idle current stabilizing resistors $R_{Ea}$ and $R_{Eb}$ are provided. The SEPP circuit is provided with a voltage amplifying circuit including transistors $Q_{11a}$ and $Q_{12a}$, a resistor $R_{11a}$ and constant current sources $I_{11a}$ and $I_{12a}$, and also with a voltage amplifying circuit including transistors $Q_{11b}$ and $Q_{12b}$, a resistor $R_{11b}$ and constant current sources $I_{11b}$ and $I_{12b}$.

When a positive input signal voltage is supplied to the circuit, a current $I_{E1}$ flows in the transistor $Q_{8a}$ so that the voltage between the points p and q is increased. A voltage increment is developed across the resistor $R_{11a}$ by the transistor $Q_{12a}$, which acts as emitter-follower, thus suppressing the variation of the voltage between the points p and r and thus causing an idle current $I_d$ to continuously flow in the transistor $Q_{8b}$. Accordingly, when a positive input signal is supplied, the idle current of the transistor $Q_{8b}$ is not interrupted. Similarly, in the case when a negative input signal voltage is applied, the increment of the voltage between the points p and r is developed across the resistor $R_{11b}$ by the transistor $Q_{12b}$, thus causing the idle current to continuously flow in the transistor $Q_{8a}$. Thus, the circuit acts as a cutoffless class B SEPP circuit. In this case, the transfer characteristic is as indicated by the curve $a_0$ in FIG. 2. In FIG. 2, the curves $b_0$ and $c_0$ indicate the transfer characteristics of the transistors $Q_{7b}$ and $Q_{8b}$ and of the transistors $Q_{7a}$ and $Q_{8a}$, respectively.

In the conventional class B SEPP circuit, to set the idle current, after the transistors $Q_{12a}$ and $Q_{12b}$ are placed substantially in the cutoff state by adjusting a variable resistor $V_{R2}$, the idle current is set to a predetermined value by adjusting a variable resistor $V_{R1}$. The idle current thus controlled changes with time, temperature and supply voltage, and the operating point also changes. Thus, it is difficult to control the idle current.

Furthermore, it is impossible to accurately predict the value of the idle current when the input signal is supplied.

The circuit should be temperature compensated, but it is impossible to provide 100% temperature compensation.

If the positive feedback ratio is set to unity so that the voltage between the points p and q is reflected across the resistor $R_{11a}$, then the stabilizing action of the resistor $R_{Ea}$ is completely lost, as a result of which there is a greater tendency for oscillation or thermal runaway to occur. Therefore, the positive feedback ratio must be less than unity. Accordingly, when a large signal is inputted, complete noncutoff operation is not obtainable. In order to obtain complete noncutoff when a large signal is present, it is necessary to set the idle current to a large value, which reduces the gain of the circuit.

Furthermore, the output impedance is high and changes with the level of the input signal voltage. Also, the distortion due to the exponential transfer characteristics of the transistors $Q_{7a}$, $Q_{7b}$, $Q_{8a}$ and $Q_{8b}$ is not significantly reduced. The transfer characteristic is nonlinear as indicated by the curve $a_0$ in FIG. 2, and the composite output current is significantly distorted as shown in FIG. 3. Thus, the conventional cutoffless class B SEPP circuit is disadvantageous in various points.

SUMMARY OF THE INVENTION

In view of the foregoing, an object of the invention is to provide a cutoffless emitter-follower type SEPP circuit in which the above-described drawbacks have been eliminated, temperature compensation for the idle current is unnecessary, that is, it is unnecessary to adjust the idle current, and which has a lower amount of distortion.

Accordingly, the invention provides an emitter-follower type single-ended push-pull circuit in which resistors are connected between an output terminal and emitters or sources of output transistors, and drive transistors are coupled to drive respective ones of the output transistors, and in which the improvement comprises first and second complementary current mirror circuits, and first and second complementary differential amplifier circuits having the first and second current mirror circuits, respectively, coupled thereto as loads. Each of the first and second differential amplifier circuits includes a first transistor to which an input signal voltage is applied as an input signal, a second transistor to which a voltage at the output terminal is applied as an input signal with the second transistor being connected in parallel with the first transistor, and a third transistor to which a voltage corresponding to an emitter or source voltage of a respective one of the output transistors is applied as an input voltage, a collector or drain output of the third transistor being employed as a drive output to a respective one of the drive transistors.

DESCRIPTION OF THE PREFERRED EMBODIMENTS

The invention will now be described in detail with reference to preferred embodiments.

Figure 1:
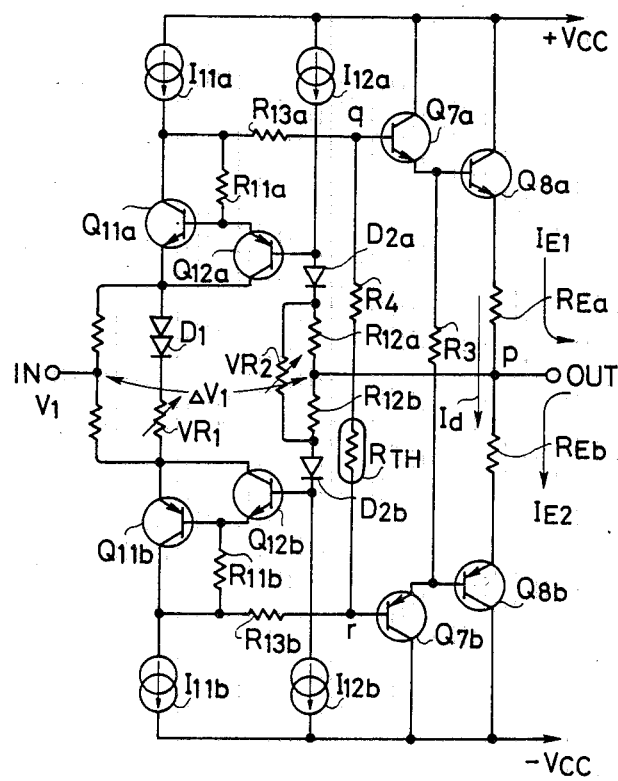
FIG. 1 is a circuit diagram showing a conventional emitter-follower type SEPP circuit.
Figure 2:
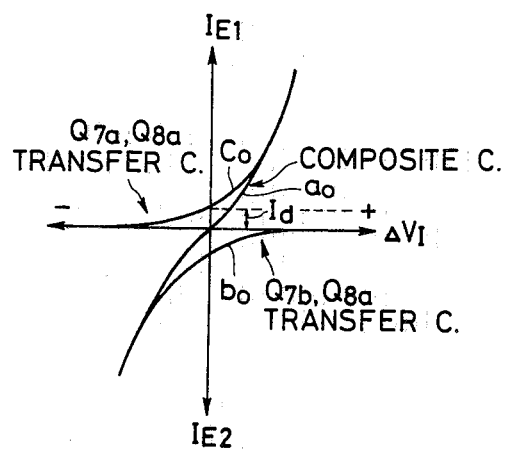
FIG. 2 is a graphical representation indicating the transfer characteristics of the conventional emitter-follower type SEPP circuit.
Figure 3:
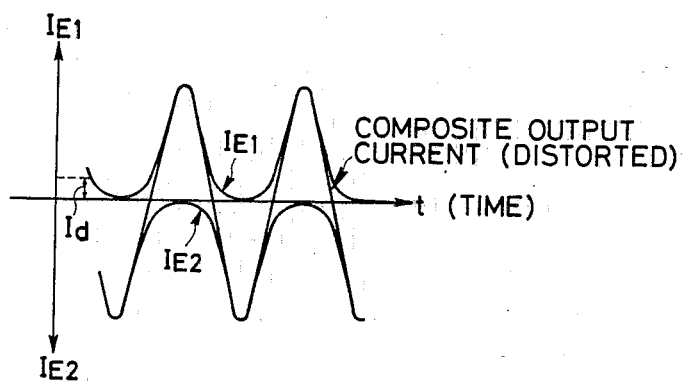
FIG. 3 is also a graphical representation indicating the output current waveform of the conventional emitter-follower type SEPP circuit.
Figure 4:
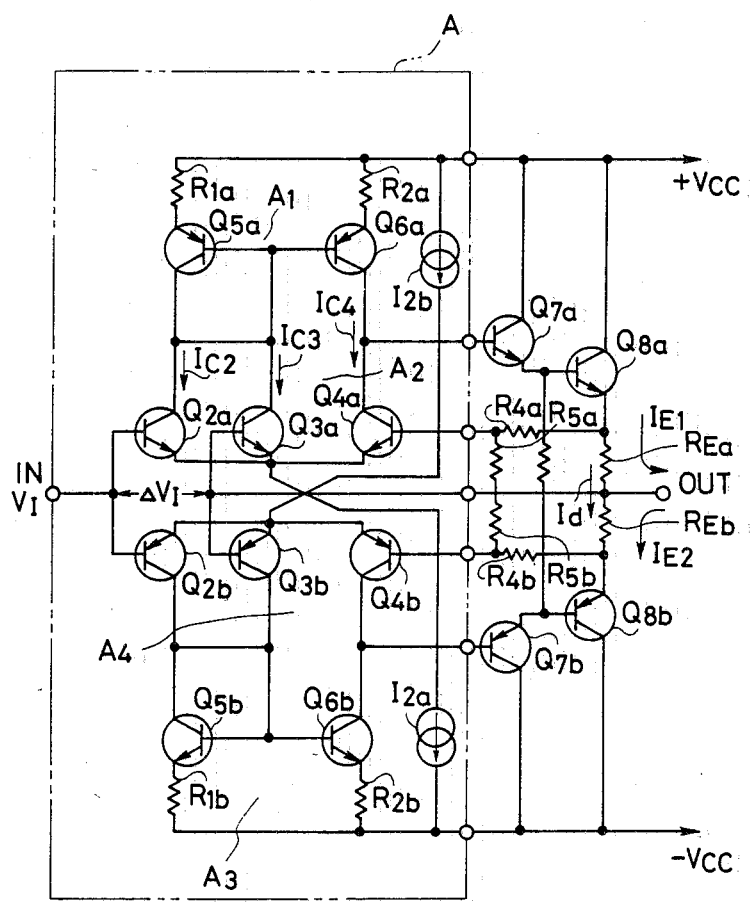
FIG. 4 is a circuit diagram showing the arrangement of a first embodiment of the invention.
Figure 8:
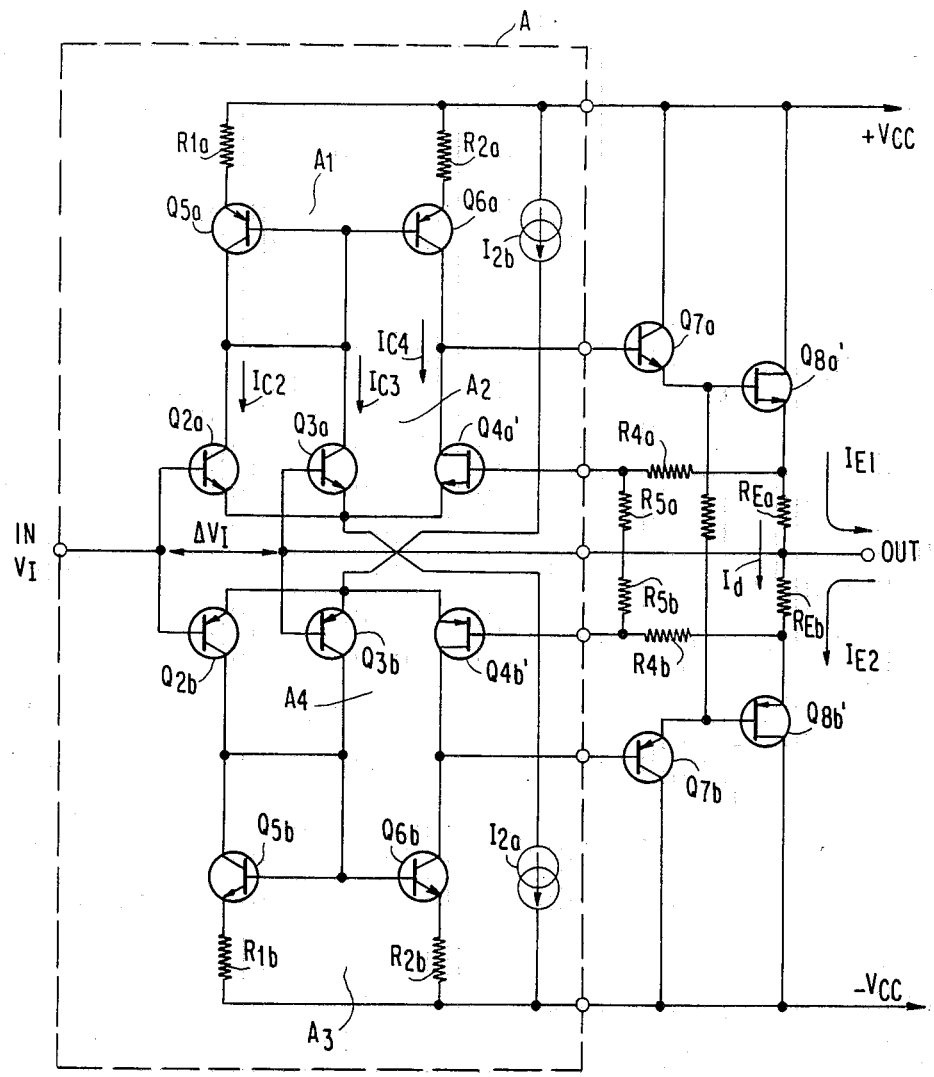
FIGS. 8 and 9 are embodiments corresponding to FIGS. 4 and 7, respectively, in which FETs are substituted for some of the transistors.

FIG. 4 is a circuit diagram of a first preferred embodiment of a circuit of the invention. The following discussion of FIG. 4 will apply equally to FIG. 8.

Transistors $Q_{8a}$ and $Q_{8b}$, and resistors $R_{Ea}$ and $R_{Eb}$ connected respectively between the emitter of the transistor $Q_{8a}$ and an output terminal OUT and between the emitter of the transistor $Q_{8b}$ and the output terminal OUT, form an emitter-follower type SEPP circuit which drives a load (not shown) connected to the output terminal OUT. Transistors $Q_{7a}$ and $Q_{7b}$ form drive stages for driving the transistors $Q_{8a}$ and $Q_{8b}$, respectively.

An error amplifier A is provided for driving the transistors $Q_{7a}$ and $Q_{7b}$. The error amplifier includes a current mirror circuit $A_1$ composed of transistors $Q_{5a}$ and $Q_{6a}$ and resistors $R_{1a}$ and $R_{2a}$, a differential amplifier circuit $A_2$ having the current mirror circuit $A_1$ as its load, a current mirror circuit $A_3$ composed of transistors $Q_{5b}$ and $Q_{6b}$ and resistors $R_{1b}$ and $R_{2b}$, and a differential amplifier circuit $A_4$.

The differential amplifier circuit $A_2$ includes transistors $Q_{2a}$ and $Q_{3a}$ coupled in parallel by having emitters and collectors connected together, a transistor $Q_{4a}$, and a constant current source $I_{2a}$. The emitters of the transistors $Q_{2a}$, $Q_{3a}$ and $Q_{4a}$ are connected together and to the constant source $I_{2a}$. The collectors of the transistors $Q_{2a}$ and $Q_{3a}$ are connected together and to the collector of the transistor $Q_{5a}$. The collector of the transistor $Q_{4a}$ is connected to the collector of the transistor $Q_{6a}$. An input voltage supplied to an input terminal IN is applied to the base of the transistor $Q_{2a}$. A voltage developed at the output terminal OUT is applied to the base of the transistor $Q_{3a}$. The emitter voltage of the transistor $Q_{8a}$ is applied to the base of the transistor $Q_{4a}$. The collector output of the transistor $Q_{4a}$ is applied to the base of the transistor $Q_{7a}$ to drive the latter.

As in the differential amplifier $A_2$, the differential amplifier $A_4$ is made up of transistors $Q_{2b}$, $Q_{3b}$ and $Q_{4b}$ and a current source $I_{2b}$, and is used to drive the transistor $Q_{7b}$.

In the embodiment of the invention thus constructed, when no signal voltage is supplied to the input terminal IN, an idle current $I_d$ flows in the transistors $Q_{8a}$ and $Q_{8b}$. A voltage developed across the resistor $R_{Ea}$ by the idle current $I_d$ is applied to the base of the transistor $Q_{4a}$. Due to the negative feedback action of the error amplifier A, an offset voltage $V_{OFF}$ developed by the transistor $Q_{4a}$ is made equal to the voltage which is developed across the transistor $R_{E1}$.

If the base current of the transistor $Q_{7a}$ is disregarded, then the offset voltage is as follows:

$$V_{OFF} = \frac{kT}{q} \log_e \left( \frac{I_{C4}}{I_{C2}} \right), \tag{1}$$

where k is Boltzmann's constant, q is the electron charge, T is absolute temperature, $I_{C2}$ is the collector current of the transistor $Q_{2a}$ or $Q_{3a}$, and $I_{C4}$ is the collector current of the transistor $Q_{4a}$.

If the resistors $R_{1a}$ and $R_{2a}$ are of equal resistances, $I_{C4}:I_{C2}=2:1$. Therefore, at room temperature:

$$V_{OFF} = \frac{kT}{q} \log_e 2 = 18 \text{ mV}. \tag{2}$$

For instance, if the value of the resistor $R_{Ea}$ is 0.22 ohms, the idle current $I_d$ is:

$$I_d = V_{OFF}/R_{Ea} = 81.8 \text{ mA}. \tag{3}$$

That the idle current can be determined irrespective of the characteristics of the transistors $Q_{7a}$ and $Q_{8a}$.

$$I_d = \frac{V_{OFF}}{R_{Ea}} = \frac{kT}{R_{Ea}} \log_e 2. \tag{4}$$

Therefore, the temperature coefficient of the idle current $I_d$ is:

$$dI_d/dT = \frac{k}{R_{Ea}q} \log_e 2 \tag{4}$$

$$\cong \frac{0.06 \text{ (mV)}}{R_{Ea}q \text{ (ohms)}}$$

$$\cong +0.27 \text{ (ma/°C.)}. \tag{5}$$

This temperature coefficient is so small that no problem is caused in practice.

The same is also the case for the side of the transistors $Q_{8b}$ and $Q_{7b}$, the current mirror circuit $A_3$ and the differential amplifier $A_4$.

When a positive, large amplitude signal voltage is supplied to the input terminal IN, the transistors $Q_{3a}$ and $Q_{2b}$ are placed in the cutoff state, and therefore, with respect to a positive input signal voltage, the error amplifier receives the signals on the bases of the transistors $Q_{2a}$ and $Q_{4a}$ as inputs. In this operation, the current in the transistor $Q_{8b}$ is controlled by the error amplifier with the bases of the transistors $Q_{3b}$ and $Q_{4b}$ as inputs. In this case, in order to prevent the transistor $Q_{8b}$ from being cut off at all times, it is necessary that the offset voltages $V_{OFF}$ of the transistor $Q_{4b}$ be set slightly higher. In practice, the resistance of the resistor $R_{1b}$ is selected to be slightly higher than that of the resistor $R_{2b}$ so that equal currents do not flow in the two legs of the current mirror circuit A$_3$. The current flowing in the transistor Q$_{4b}$ is therefore increased.

In the case where a negative input signal is present, the operation is the same as that described above due to the symmetrical nature of the circuit.

As is apparent from the above description, the negative feedback system acts on the input signal and the idle current simultaneously. Therefore, no temperature compensation at all is needed, and thus no adjustment is required. Thus, a cutoffless SEPP circuit can be obtained in which the output impedance is low, the composite transfer characteristic is as indicated by a straight line a in FIG. 5, and the output current waveform has no distortion, as indicated by a curve b in FIG. 6.

Figure 5:
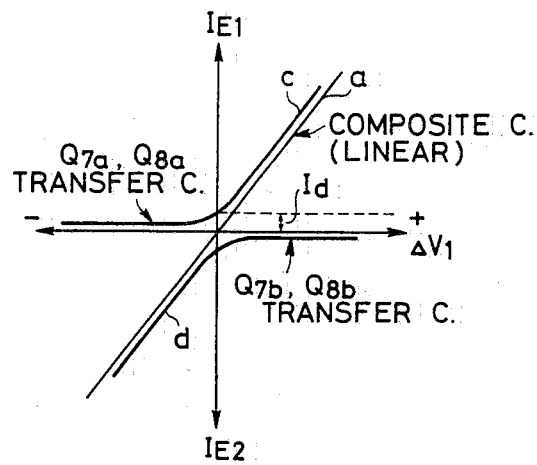
FIG. 5 is a graphical representation indicating the transfer characteristics of the circuit of the first embodiment of the invention.
Figure 6:
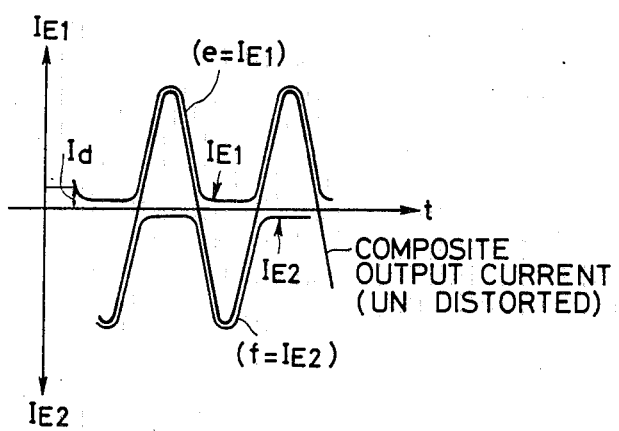
FIG. 6 is a graphical representation indicating an ou current waveform of the circuit of the first embodiment of the invention.

In FIG. 5, curves and d show the transfer characteristic of the transistor Q$_{7a}$ and Q$_{8a}$, and the transfer characteristics of the transistor Q$_{7b}$ and Q$_{8b}$, respectively. In FIG. 6, curves e and f indicate the waveforms of currents in the transistors Q$_{8a}$ and Q$_{8b}$, respectively.

The same effect can be obtained by employing a method in which a voltage divider circuit composed of resistors R$_{4a}$ and R$_{5a}$ and a voltage divider circuit composed of resistors R$_{4b}$ and R$_{5b}$ are connected to the resistors R$_{Ea}$ and R$_{Eb}$, respectively, so that the outputs of the voltage divider circuits are applied to the bases of the transistors Q$_{4a}$ and Q$_{4b}$, respectively.

If, in the above-described embodiment of the invention, cascode-connected transistors are connected to the transistors Q$_{6a}$, Q$_{6b}$, Q$_{2a}$, Q$_{3a}$, Q$_{2b}$ and Q$_{3b}$ so that the collector-base voltages of the transistors are decreased and the difference in V$_{BE}$ due to the Early effect is eliminated, then correct mirror circuits can be obtained, and accordingly the correct offset voltage V$_{OFF}$ obtained.

Figure 7:
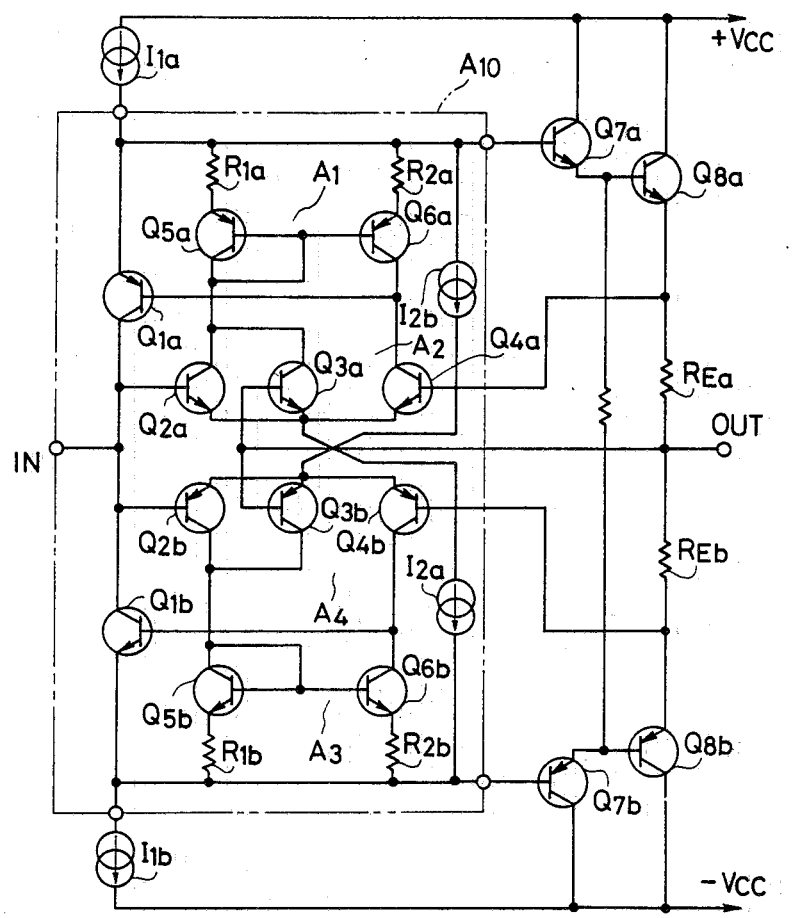
FIG. 7 is a circuit diagram showing a circuit of a second embodiment of the invention.
Figure 9:
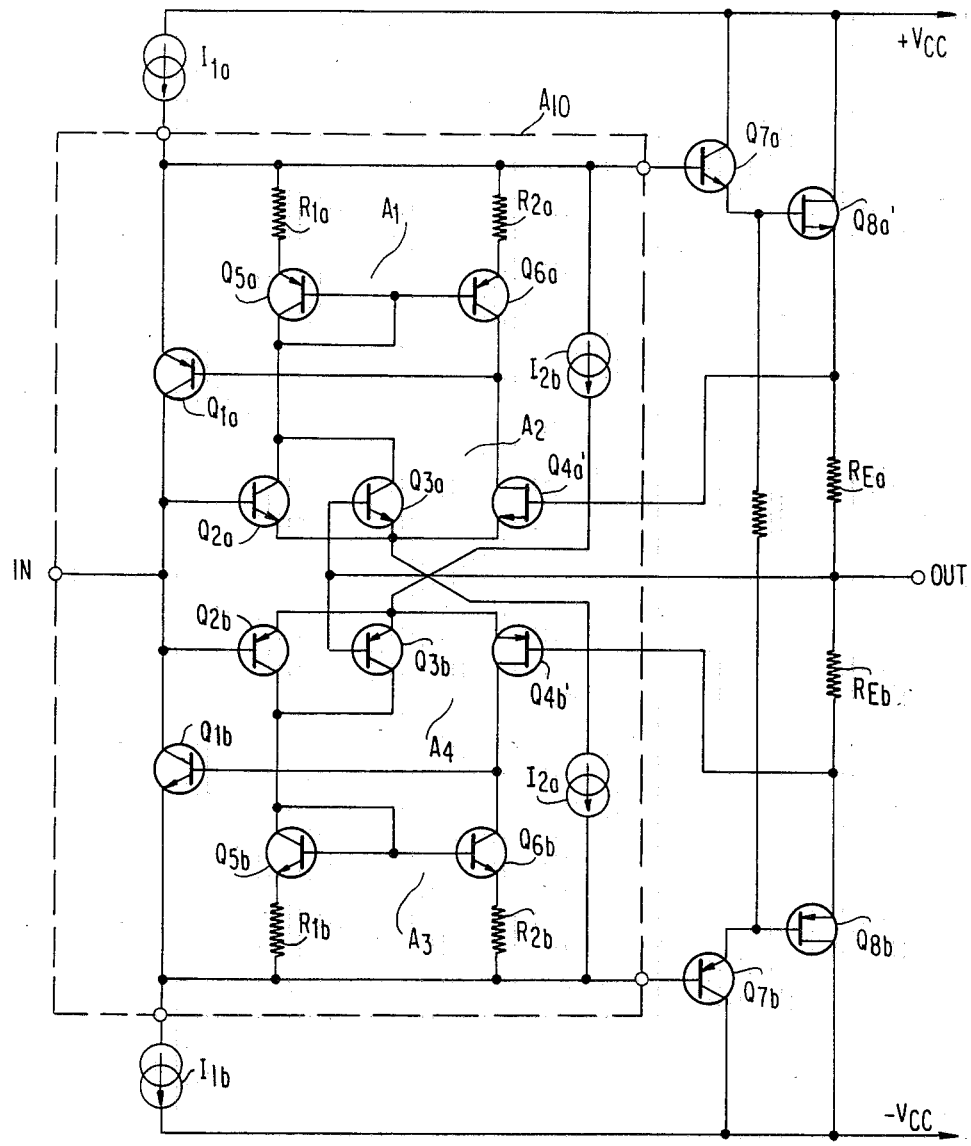

Another embodiment of the invention will now be described with reference to FIG. 7, which is a circuit diagram showing a second embodiment of the invention. The following discussion of FIG. 7 will apply equally to FIG. 9.

The circuit of the second embodiment includes a constant current source I$_{1a}$ for driving the transistor Q$_{7a}$, and a constant current source I$_{1b}$ for driving the transistor Q$_{7b}$. An error amplifier A$_{10}$ is formed by modifying the error amplifier A by connecting a transistor Q$_{1a}$ between the resistor R$_{1a}$ and the base of the transistor Q$_{2a}$, connecting the base of the transistor Q$_{1a}$ to the collector of the transistor Q$_{4a}$, connecting a transistor Q$_{1b}$ between the resistor R$_{1b}$ and the base of the transistor Q$_{2a}$, and connecting the base of the transistor Q$_{1b}$ to the collector of the transistor Q$_{4b}$. The transistor Q$_{1a}$ operates to absorb current from the constant current source I$_{1a}$, and the amount of current thus absorbed is controlled by the collector output of the transistor Q$_{4a}$, namely, the output of the error amplifier A$_{10}$. Similarly, the transistor Q$_{1b}$ operates to absorb current from the constant current source I$_{1b}$, and the amount of current thus absorbed is controlled by the collector output of the transistor Q$_{4b}$, namely, the output of the error amplifier.

The operation of the second embodiment is the same as that of the first embodiment. However, instead of the transistors Q$_{7a}$ and Q$_{7b}$ being driven by the outputs of the transistors Q$_{4a}$ and Q$_{4b}$, respectively, in the second embodiment, the transistors Q$_{7a}$ and Q$_{7b}$ are driven by the outputs of the transistors Q$_{1a}$ and Q$_{1b}$, respectively. In this case, not only is the gain increased, but also the effect of the base currents of the transistors Q$_{7a}$ and Q$_{7b}$ on the offset voltage V$_{OFF}$ is eliminated.

As the constant current sources I$_{1a}$ and I$_{1b}$ are added to the circuit, the maximum voltage which can be applied to the error amplifier A$_{10}$ may be low. Accordingly, the error amplifier is realized suitably as an integrated circuit.

Even if, instead of the input signal voltage application point (a), current signal application points (b) and (c) are employed, that is, even if the constant current sources I$_{1a}$ and I$_{1b}$ are used as signal current sources, a cutoffless class B SEPP can be obtained in which no temperature compensation is required (but with the same amount of distortion as in the conventional circuit).

If the transistor Q$_{1a}$ and Q$_{1b}$ are replaced by Darlington-connected transistors and the transistors Q$_{7a}$ and Q$_{8a}$ and the transistors Q$_{7b}$ and Q$_{8b}$ are replaced by three-stage Darlington-connected transistors, then the loop gain of the SEPP circuit can be increased.

Furthermore, with the connection of the emitter and the collector of the transistor Q$_{1a}$ reversed, the junction point of the collectors of the transistors Q$_{5a}$ and Q$_{2a}$ may be connected, as the output terminal of the error amplifier A$_{10}$, to the base of the transistor Q$_{1a}$. The current mirror circuit A$_3$, the transistor Q$_{1b}$ and the transistors Q$_{5b}$ and Q$_{2b}$ may be connected in the same manner. Similar to the first embodiment shown in FIG. 4, the idle current I$_d$ can be increased by connecting the resistors R$_{Ea}$ and R$_{Eb}$ to resistive voltage divider circuits.

In the first and second embodiments of the invention, in order to set the offset voltage V$_{OFF}$ with respect to the equilibrium of the current mirror circuits A$_1$ and A$_3$, I$_{C4}$>(I$_{C2}$+I$_{C3}$) is obtained by establishing R$_{1a}$, R$_{1b}$>R$_{2a}$, R$_{2b}$. However, the offset voltage V$_{OFF}$ may be set by other techniques. For instance, with R$_{1a}$=R$_{2a}$ and R$_{1b}$=R$_{2b}$, bias voltages can be applied to the bases of the transistors Q$_{2a}$ and Q$_{3a}$ and to the bases of the transistors Q$_{2b}$ and Q$_{3b}$. Alternatively, absorbing constant current sources can be connected to the transistors Q$_{5a}$ and Q$_{5b}$ to establish I$_{C4a}$>(I$_{C2a}$+I$_{C3a}$) and I$_{C4b}$>(I$_{C2b}$+I$_{C3b}$).

As is apparent from the above description, the circuit of the invention is designed so that a negative feedback loop is formed for both the signal and the idle current which affects them simultaneously. Accordingly, the idle current is maintained unchanged, irrespective of changes of ambient temperature or supply voltage and the passage of time. That is, the operating point is maintained unchanged. Thus, the circuit is stable and needs no temperature compensation components such as varistors or thermistors. Furthermore, irrespective of the presence or absence of an input signal and the magnitude of the signal, the idle current is maintained constant, and thus completely cutoffless class B operation is effected without adjustment. In addition, the output impedance is low and the amount of distortion is small, and therefore the design and control can be readily achieved.

I claim:

1. In an emitter-follower type single-ended push-pull circuit having a plurality of transistors, each of said transistors having first, second, and third terminals and conducting between said first and second terminals in accordance with a signal applied at said third terminal, in which resistors are connected between an output terminal and said first terminals of output transistors, and drive transistors are coupled to drive respective ones of said output transistors, the improvement wherein said circuit further comprises: first and second complementary current mirror circuits; and first and second complementary differential amplifier circuits having said first and second current mirror circuits, respectively, coupled thereto as loads, each of said first and second differential amplifier circuits comprising: a first transistor to which an input signal voltage is applied as an input signal; a second transistor to which a voltage at said output terminal is applied as an input signal, said second transistor being connected in parallel with said first transistor; and a third transistor to which a voltage corresponding to a voltage at the first terminal of a respective one of said output transistors is applied as an input voltage, an output at the second terminal of said third transistor being employed as a drive output to a respective one of said drive transistors.

2. The emitter-follower type single-ended push-pull circuit of claim 1, further comprising first and second current sources having first terminals coupled to respective power source terminals and second terminals coupled to first terminals of said first through third transistors of respective ones of said differential amplifiers.

3. The emitter-follower type single-ended push-pull circuit of claim 1, wherein each of said first terminals is an emitter, each of said second terminals is a collector, and each of said third terminals is a base.

4. The emitter-follower type single-ended push-pull circuit of claim 1, wherein the first terminal of said third transistor and each of said output transistors is a source, and the second terminal of said third transistor and of each of said output transistors is a drain.

5. In an emitter-follower type single-ended push-pull circuit having a plurality of transistors, each of said transistors having first, second, and third terminals and conducting between said first and second terminals in accordance with a signal applied at said third terminal, in which resistors are connected between an output terminal and said first terminals of output transistors, and drive transistors are coupled to drive respective ones of said output transistors, the improvement wherein said circuit further comprises: first and second complementary current mirror circuits; first and second complementary differential amplifier circuits having said first and second current mirror circuits, respectively, coupled thereto as loads, each of said first and second differential amplifier circuits comprising: a first transistor; a second transistor to which a voltage at said output terminal is applied as an input signal and which is connected in parallel with said first transistor; and a third transistor to which a voltage corresponding to a voltage at the first terminal of said respective output transistor is applied as an input signal; two constant current sources; and two fourth transistors, each fourth transistor being connected to a respective one of said constant current sources and an input terminal of the respective first transistor and being driven by an output of the respective differential amplifier circuit to absorb current supplied by said respective constant current source, a respective one of said constant current sources being employed as a drive output to a respective one of said drive transistors.

6. The emitter-follower type single-ended push-pull circuit of claim 5, wherein an input signal is supplied to said input terminals of said first transistors.

7. The emitter-follower type single-ended push-pull circuit of claim 5, wherein said constant current sources are coupled as input signal current sources.

8. The emitter-follower type single-ended push-pull circuit of claim 5, wherein each of said first terminals is an emitter, each of said second terminals is a collector, and each of said third terminals is a base.

9. The emitter-follower type single-ended push-pull circuit of claim 5, wherein the first terminal of said third transistor and each of said output transistors is a source, and the second terminal of said third transistor and of each of said output transistors is a drain.

* * * * *